United States Patent [19]

Anderson et al.

[11] Patent Number: 5,071,826

[45] Date of Patent: Dec. 10, 1991

[54] ORGANOMETALLIC SILVER ADDITIVES FOR CERAMIC SUPERCONDUCTORS

[75] Inventors: John T. Anderson, Woodside; V. K. Nagesh, Cupertino; Richard C. Ruby, Menlo Park, all of Calif.

[73] Assignee: Hewlett-Packard Company, Palo Alto, Calif.

[21] Appl. No.: 423,511

[22] Filed: Oct. 13, 1989

Related U.S. Application Data

[63] Continuation of Ser. No. 74,799, Jul. 17, 1987, abandoned, which is a continuation-in-part of Ser. No. 32,414, Mar. 30, 1987, abandoned.

[51] Int. Cl.$^5$ .................. C22C 24/12; H01L 39/12
[52] U.S. Cl. ........................... 505/1; 252/521; 419/20; 419/21; 419/22; 419/35; 428/545; 505/734; 505/785
[58] Field of Search ............. 505/734, 1, 785; 75/234, 232, 235; 419/20, 21, 22, 35; 428/545; 252/521

[56] References Cited

U.S. PATENT DOCUMENTS

| | | | |
|---|---|---|---|
| 3,796,553 | 3/1974 | Daunt | 174/126.5 |
| 3,815,224 | 6/1974 | Pickus et al. | 174/126.5 |
| 4,050,147 | 9/1977 | Winter et al. | 29/599 |
| 4,235,944 | 11/1980 | Felten | 427/125 |
| 4,316,785 | 2/1982 | Suzuki et al. | 427/63 |
| 4,358,783 | 11/1982 | Hebard et al. | 427/63 |
| 4,464,416 | 8/1984 | Liepins | 427/250 |
| 4,485,094 | 11/1984 | Peber et al. | 427/126.3 |
| 4,622,169 | 11/1986 | Rickle | 252/519 |
| 4,668,533 | 5/1987 | Miller | 427/304 |
| 4,770,701 | 9/1988 | Henderson et al. | 75/235 |
| 4,826,808 | 5/1989 | Yurek et al. | 505/1 |
| 4,831,707 | 5/1989 | Goddard et al. | 29/419.1 |
| 4,892,861 | 1/1990 | Ray | 505/1 |

FOREIGN PATENT DOCUMENTS 56-85814 7/1981 Japan.
085814 7/1981 Japan.

OTHER PUBLICATIONS

Moiseer et al. *Fiz. Nizki. Temp.* vol. 13, No. 6 Jun. 1987, pp. 648-651 (w/english Trans).
McCallum et al. *Advanced Ceramic Materials* vol. 2, No. 3B Jul. 1987 pp. 388-400.
Gwek et al. *J. Electrochemical Society* vol. 134, No. 10, Oct. 1987, pp. 2635-36.
Saito et al. Jap. Journal App. Phys. Mar. 1987 pp. L223-224.
Saito et al. Jap. Journal App. Phys. May 1987 pp. L832-833.
Chem. Abs. No. 107: 227120r, Moiseer et al.
"Superconductivity at 93 K in a New Mixed-Phase Y-Ba-Cu-O Compound System at Ambient Pressure", Physical Review letters, vol. 58, No. 9; Mar. 2, 1987, Wu, et al.
"Superconductivity and Magnetism in High-T$_c$ Superconductor YBaCuO", J. Z. Sun, et al., Dept. of Applied Physics, Standford University, PACS #: 74.30.-E, 74-70.-B.

*Primary Examiner*—Paul Lieberman
*Assistant Examiner*—John Boyd

[57] ABSTRACT

A method for making metal/ceramic superconductor thick film structures including the steps of preparing a silver/superconductor ink, applying the ink to a substrate, evaporating the ink's binder, decomposing a silver compound in the residue to coat the superconductor grains, sintering the coated superconductor grains, and oxygenating the superconductor grains through the silver coating. The resultant inter-granular silver increases the critical current and mechanical strength of the superconductor.

6 Claims, No Drawings

ORGANOMETALLIC SILVER ADDITIVES FOR CERAMIC SUPERCONDUCTORS

This application is a continuation of application Ser. No. 07/074,799 filed July 17, 1987, now abandoned.

DESCRIPTION

CROSS-REFERENCES TO RELATED APPLICATIONS

This patent application is a continuation-in-part of copending patent application Ser. No. 07/032,414, filed Mar. 30, 1987 on behalf of Richard C. Ruby, V. K. Nagesh, and John T. Anderson, and entitled "Superconductor Inks, Thick Film Structures, and Methods for Making Same."

TECHNICAL FIELD

This invention relates generally to super-conductors, and more particularly to methods for making superconducting thick film structures.

BACKGROUND ART

The phenomenon of superconductivity was discovered by K. H. Onnes in 1911 when he demonstrated that the electrical resistance of mercury drops to zero when it is cooled to approximately 4 Kelvin (K). For many years the phenomenon of superconductivity remained a scientific curiosity, with few practical applications.

On March 2, 1987, M. K. Wu et al. published a paper entitled "Superconductivity at 93 K in a New Mixed-Phase Y-Ba-Cu-O Compound System at Ambient Pressure" in Physical Review Letters, Volume 58, Number 9. This announcement caused considerable excitement in the scientific and business communities because, for the first time, a superconductor material had been discovered which could use liquid nitrogen as a coolant. Since liquid nitrogen cooling systems are at least an order of magnitude less expensive than liquid helium cooling systems, many applications for superconductors suddenly became practical after Wu's discovery.

Standard processing of YBaCuO superconductor, as reported in the literature, results in a multi-crystalline solid comprising numerous, sintered-together superconducting grains. Measurements by many researchers in the field have indicated that the critical current (i.e. the maximum superconducting current of a material) that can be carried by this multi-crystalline structure is typically in the vicinity of $10^3$ amperes./cm$^2$. This contrasts with a critical current of approximately $10^5$ amperes/cm$^2$ in single crystal YBaCuO. Unfortunately, single crystals of this superconducting substance have, to date, only been made as thin-films or as crystallites having maximum dimensions of only a few millimeters.

Because the critical current in multi-crystalline YBaCuO is approximately two orders of magnitude less than the critical current in single crystal YBaCuO, it appears that the individual superconducting grains are insulated from each other. The insulation may result from inter-granular contamination, or may simply be empty space between the grains. In either event, the superconducting current must tunnel through the insulation between the superconducting grains, thus drastically reducing the critical current in multi-crystalline YBaCuO.

DISCLOSURE OF THE INVENTION

An object of this invention is to increase the magnitude of the critical current for multi-crystalline ceramic superconductor materials.

Another object of this invention is to improve the mechanical properties of multi-crystalline ceramic superconductor materials.

Briefly, the invention comprises the addition of silver into the inter-granular matrix of multi-crystalline ceramic superconductor materials. For example, to make a silver/superconductor ink, a solution of a silver compound (typically toluene) is added to powdered, bulk superconductor and then mixed into a suitable binder. The ink is then applied to a substrate and heated to drive off the binder and to decompose the silver compound. Next, the substrate is heated to sinter the superconductor grains (which have been wetted by the silver), and is finally annealed in an oxygen environment to optimize the oxygen content of the superconductor.

An advantage of this invention is that the inter-granular silver is highly conductive, thereby greatly enhancing the connectivity between the grains of superconductor and thus increasing the critical current of the superconducting ink or bulk material.

Another advantage of this invention is that the silver mechanically improves the ceramic superconductor material by increasing its strength and workability.

These and other objects and advantages will become apparent to those skilled in the art upon a reading of the following detailed descriptions.

BEST MODE FOR CARRYING OUT THE INVENTION

The preferred embodiments of the present invention will be discussed in terms of the new YBaCuO class of high temperature superconductors that were discovered by Wu, supra. However, it should be apparent to those skilled in the art that the methods and structures described herein could be practiced with a wide variety of ceramic superconducting materials, many of which are yet to be discovered.

In the prior art, YBaCuO samples are prepared from mixtures of high purity $Y_2O_3$, $BaCO_3$, and CuO powders. The powders are mixed in a solvent, such as methanol or water, and subsequently heated to 100° C. to evaporate the solvent. The resultant mixture is then heated for six hours in air at 850° C. to produce a dark, green powder. The green powder is then heated for an additional six hours at 950° C. to become a black, porous solid. The result is a multi-crystalline bulk material generally characterized as $Y_1Ba_2Cu_3O_{6.5-7}$. A detailed explanation of the method steps involved in the manufacture of superconducting YBaCuO and a description of some of its properties can be found in a paper entitled "Superconductivity and Magnetism in High-$T_c$ Superconductor YBaCuO", J. Z. Sun, et al., Department of Applied Physics, Stanford University, PACS #: 74.30.-E, 74.70.-B.

The selection of silver as an inter-granular constituent is based upon several properties of the metal including:
1) Silver does not form stable oxides in the processing range of 500–970° C. used for the YBaCuO superconductor, and thus will not compete with those materials for oxygen;
2) Silver has a high permeability to oxygen at elevated temperatures, thereby allowing oxygen annealing of the superconductor materials despite a silver coating on the particles;

3) Silver has a high conduction electron density, which greatly enhances the strength of the superconducting paired electrons in the silver vis-a-vis poorer conductors and/or an oxide; and 4) Silver does not react with the YBaCuO class of superconductors and, therefore, will not degrade the superconductor and will remain in its inter-granular position.

The dimensions of the inter-granular silver are preferably less than 0.1 microns. If the thickness of the silver is too large, the resultant material may no longer be a high-temperature superconductor, while if the silver is too thin interstices may form between the grains. Silver coatings of the desired thickness can be achieved by pyrolysis of an organometallic silver compound, such as silver neodecanoate, silver mercaptide, and silver resinate.

EXAMPLE 1

Silver/Superconductor Thick Film Structures

Many film structures can be made from a silver/superconductor ink of the present invention. For example, silver/superconductor ink can be used to make integrated circuit interconnects in multi-layer ceramic structures, delay lines, strip lines, convolvers, etc.

A process for making a superconducting device from such an ink is as follows:

1) Prepare a ceramic superconductor by any of a variety of known methods;
2) Powder the ceramic superconductor to the particle size suitable for an ink (preferably less than 1–5 microns);
3) Compound the superconductor with the additives necessary for an ink (an organic carrier such as ethyl cellulose in terpineol is suitable) and include sufficient quantities of a silver compound (such as silver neodecanoate in toluene) to cover the superconductor particles with metallic silver approximately 0.05 microns thick;
4) Apply the ink to a suitable substrate in a desired pattern;
5) Air dry the ink to evaporate the binder and solvent;
6) Heat the substrate bearing the dried ink to approximately 300° C. to decompose the silver compound;
7) Raise the temperature of the substrate to approximately 600–800° C. to sinter the superconductor matrix;
8) Reduce the temperature to approximately 500° C. in a one-atmosphere oxygen oven for approximately 20 hours to optimize the oxygen content of the superconductor; and
9) Cool the substrate below 77° K. to cause the silver/superconductor material to become superconducting.

EXAMPLE 2

Alternative Method for Making Silver/Superconductor Thick Film Structures

Example 2 differs from Example 1 only in the method for making the superconductor ink, which includes the steps of:

1) Preparing a ceramic superconductor by any of a variety of known methods;
2) Powdering the ceramic superconductor to a particle size suitable for an ink (preferably less than 1–5 microns);
3) Mixing the powdered superconductor with a solution of a silver compound (such as silver neodecanoate in toluene) in sufficient quantity to cover the superconductor particles with metallic silver approximately 0.05 microns thick;
4) Heating the mixture to approximately 100° to drive away the solvent;
5) Heating the mixture to approximately 300° C. to decompose the silver compound; and
6) Compounding the silver coated superconductor with additives (such as ethyl cellulose in terpineol) to make an ink.

The remainder of the method for making silver/superconductor thick film structures in this second example is the same as in Example 1 starting with step 4, except that step 6 of Example 1 can be skipped.

EXAMPLE 3

Method for Making Bulk Silver/Superconductor

Bulk silver/superconductor can be used as diamagnetic bearings, resonant radio frequency cavities, etc. A process for making bulk silver/superconductor is as follows:

1) Prepare a ceramic superconductor by any of a variety of known methods;
2) Powder the ceramic superconductor to a particle size of approximately 5 microns;
3) Add sufficient quantities of a silver compound in solution to cover the superconductor particles with metallic silver approximately 0.05 microns thick;
4) Heat the silver/superconductor to approximately 100° C. to drive off the solvent of the silver compound;
5) Compact the silver/superconductor under a pressure of approximately 10,000 p.s.i.;
6) Raise the substrate to approximately 500–600° C. to sinter the superconductor matrix;
7) Reduce the temperature to approximately 500° C. in a one-atmosphere oxygen oven for approximately 20 hours to optimize the oxygen content of the superconductor; and
8) Cool the substrate below 77° K. to cause the silver/superconductor material to become superconducting.

The silver additive, whether for inks, thick films, thin films, wires, bulk materials, etc. will give the material a higher critical current and a sharper superconducting transition. Furthermore, the silver additive tends to cement the superconductor particles together, adding mechanical strength to the somewhat fragile ceramic. Also, the silver additive permits better adhesion of the superconductor material to substrates and to electrical contacts.

For applications in which very high electrical conductivity is satisfactory rather than true superconductivity, a silver conductor containing superconducting grains will have its conductivity improved by at least the volumetric fraction of the included superconductor grains. Also, the silver coating implicit in this invention allows electrical contact to be made to a superconductor material by conventional soldering or simple pressure pads.

While this invention has been described in terms of several preferred embodiments, it is intended that the true spirit and scope of the present invention be interpreted in terms of the following appended claims.

What is claimed is:

1. A method for making a superconductor mixture comprising the steps of:
   mixing an organometallic silver compound with a granular, ceramic, copper-oxide based superconductor material;
   heating the resultant mixture to cause silver of said organometallic silver compound to provide a silver coat on grains of said superconductor material; and
   heating said superconductor material and said silver in an oxidizing atmosphere to optimize the oxygen content of said superconductor material by diffusing oxygen through said silver coat of said grains and to cause said silver to substantially fill the intergranular spaces of said ceramic superconductor material, whereby said silver comprises a matrix material for said superconductor material.

2. A method as recited in claim 1 wherein said step of heating the resultant mixture to cause said silver to coat grains of said superconductor material decomposes said organometallic silver compound.

3. A method as recited in claim 2 wherein said organometallic silver compound is selected from the group of neodecanoates, mercaptides, and resinates.

4. A method for making a superconductor mixture comprising the steps of:
   mixing an organometallic silver compound with grains of a ceramic, copper-oxide based superconductor material to form a mixture;
   decomposing the organic components of said organometallic silver compound to liberate metallic silver and to provide a silver coat on said grains of said superconductor material; and
   heating said superconductor material and said silver in an oxidizing atmosphere to optimize the oxygen content of said granular superconductor by diffusing oxygen through said silver coat of said grains without oxidizing said silver.

5. A method as recited in claim 4 wherein said organometallic silver compound is selected from the group of neodecanoates, mercaptides, and resinates.

6. A method as recited in claim 4 wherein said organometallic silver compound is decomposed by heat.

* * * * *